(12) United States Patent
Choi

(10) Patent No.: US 12,189,911 B2
(45) Date of Patent: Jan. 7, 2025

(54) DISPLAY DEVICE

(71) Applicant: LG Display Co., Ltd., Seoul (KR)

(72) Inventor: Namsu Choi, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/214,431

(22) Filed: Jun. 26, 2023

(65) Prior Publication Data
US 2023/0350530 A1   Nov. 2, 2023

Related U.S. Application Data

(63) Continuation of application No. 17/353,060, filed on Jun. 21, 2021, now Pat. No. 11,714,515.

(30) Foreign Application Priority Data

Sep. 28, 2020 (KR) .......................... 10-2020-0126266

(51) Int. Cl.
   *G06F 3/044* (2006.01)
(52) U.S. Cl.
   CPC .......... *G06F 3/0448* (2019.05); *G06F 3/0443* (2019.05); *G06F 3/0446* (2019.05)
(58) Field of Classification Search
   CPC .... G06F 3/0448; G06F 3/0443; G06F 3/0446; G06F 3/0412; G06F 3/042; G06F 3/044; H04M 1/026; H04M 1/0264; H04M 2250/22; H04M 1/0266; H10K 59/8731; H10K 59/353; H10K 59/40
   See application file for complete search history.

(56) References Cited

U.S. PATENT DOCUMENTS

| | | | | |
|---|---|---|---|---|
| 2014/0118635 | A1* | 5/2014 | Yang | G06F 3/0446 349/12 |
| 2016/0147375 | A1* | 5/2016 | Bok | G06F 3/0448 345/175 |
| 2016/0179259 | A1* | 6/2016 | Watanabe | G06F 3/0446 345/174 |
| 2019/0155430 | A1* | 5/2019 | Hwang | G06F 3/0448 |
| 2021/0202621 | A1* | 7/2021 | Liang | H10K 59/1216 |
| 2021/0357093 | A1* | 11/2021 | Ma | H10K 59/131 |
| 2022/0028311 | A1* | 1/2022 | Matsueda | G09G 3/3233 |

* cited by examiner

*Primary Examiner* — Amit Chatly
(74) *Attorney, Agent, or Firm* — Morgan, Lewis & Bockius LLP

(57) ABSTRACT

A display panel includes a plurality of fist pixels disposed in a first area, a plurality of second pixels disposed in a second area surrounded by the first area, a first touch sensing portion disposed in the first area, and a second touch sensing portion disposed in the second area with a density lower than the first ouch sensing portion.

24 Claims, 12 Drawing Sheets

DISPLAY DEVICE

CROSS-REFERENCE TO RELATED APPLICATIONS

This application is a Continuation of co-pending U.S. patent application Ser. No. 17/353,060, filed on Jun. 21, 2021, which claims the priority benefit Republic of Korea Patent Application No. 10-2020-0126266, filed on Sep. 28, 2020, in the Korean Intellectual Property Office. The disclosure of each of the above prior U.S. and Korean patent applications is incorporated herein by reference in its entirety.

BACKGROUND

Technical Field

The present disclosure relates to display devices.

Discussion of the Related Art

Image display devices configured to display various information or data on a display screen act as a core device in the information and communication era. The display devices become thinner and lighter and are being developed to have high performance while being portable. Various needs for display devices for displaying an image have increased, and recently, various types of display devices, such as a Liquid Crystal Display (LCD) device, an Electroluminescence Display (ELD) device including a Quantum-dot Light Emitting Display device including a quantum dot (QD), an Inorganic Light Emitting Display device, and an Organic Light Emitting Display device, and the like. have been developed and utilized.

Further, display devices are equipped with an input unit using a touch sensor or the like and an optical unit such as a camera, a proximity sensor, or the like in order to provide a user with more diverse application functions. However, due to the attachment of the optical unit to the display devices, there is a problem that the design of the display devices becomes difficult. In particular, since the camera and the proximity sensor are required to be exposed to the outside for the entrance and exit of light, there is a problem in that an active area of the display panel is inevitably reduced.

Accordingly, in some cases, a display device has been designed to have a large bezel for installation and exposure of an optical unit, allow a portion of an associated display panel to be cut out in a notch shape, or allow the optical unit to be exposed through a hole-shape portion formed in the active area. However, because a size of a display screen is still limited due to the camera, it is not easy to implement a full-screen display in actual.

SUMMARY

To implement a full-screen display, there is proposed a scheme of assigning an imaging area, in which low-resolution pixels are disposed, in a screen of a display panel and arranging a camera and/or various sensors in a position or region opposite to the imaging area under the display panel. However, since the pixels are disposed in the imaging area, there is a problem in that light transmittance of is lowered, and the performance of the camera and/or such sensors is deteriorated. If some elements normally required to be disposed in the imaging area are omitted or reduced to address such an issue, performance related to such elements may be deteriorated. To address these issues, embodiments described herein provide a display device that enables light to effectively transmit toward an optical unit without the deterioration of corresponding basic performance. Issues or problems for solving in the present disclosure are not limited thereto, and other issues or problems will become apparent to those skilled in the art from the following description.

Accordingly, embodiments of the present disclosure are directed to a display device that substantially obviates one or more of the problems due to limitations and disadvantages of the related art.

Features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display panel is provided. The display panel includes a plurality of fist pixels disposed in a first area, a plurality of second pixels disposed in a second area surrounded by the first area, a first touch sensing portion disposed in the first area, and a second touch sensing portion disposed in the second area with a density lower than the first touch sensing portion. The first and second touch sensing portions are based on a mutual-capacitive sensing scheme, and corresponding capacitances caused by respective touch inputs into the first and second areas may be substantially equal. The second area may overlap a camera module or unit, and a density of the second pixels disposed in the second area may be lower than that of the first pixels disposed in the first area. The second area may include a light-transmitting area disposed between the second pixels, and the second touch sensing portion may not be disposed in the light-transmitting area.

An encapsulation layer may be disposed on or over the first and second pixels, and the first and second touch sensing portions may be disposed on an upper surface of the encapsulation layer.

The first and second touch sensing portions respectively may include first and second touch electrodes having a line shape, and a width of the line-shaped second touch electrode may be larger than that of the line-shaped first touch electrode. For example, a width of the line-shaped second touch electrode may be 1.2 to 2 times larger than that of the line-shaped first touch electrode. In another example, a width of the line-shaped second touch electrode may be 3 um to 24 um.

The line-shaped second touch electrode may include a first portion having a first width and a second portion having a second width larger than the first width.

The first touch sensing portion may be located on or over a bank located between the first pixels, and the second touch sensing portion may be located on or over a bank located between the second pixels.

Various specific features, configurations, techniques and processes are included in detailed description and the accompanying drawings, and will be discussed in detail below.

In accordance with aspects of the present disclosure, it is possible to provide a display device equipped with an optical unit or module without a decrease in a display area of a display panel. Further, in accordance with aspects of the present disclosure, it is possible to provide a display device capable of preventing the deterioration of touch sensing performance while improving light transmittance in an imaging area. In accordance with aspects of the present disclosure, it is possible to provide a display device having improved aesthetics and functionality.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
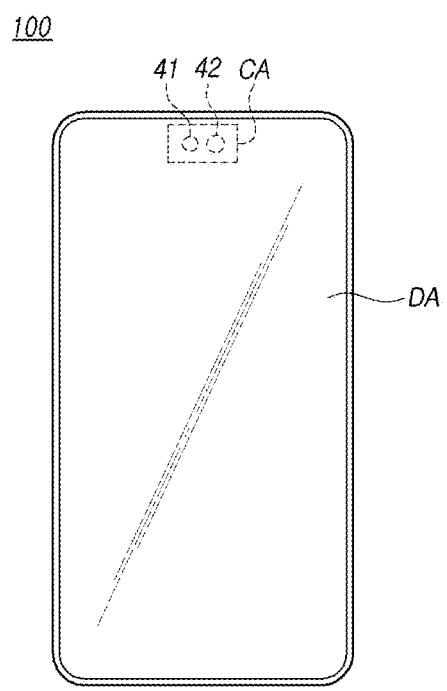
FIG. 1 illustrates schematically a display device according to aspects of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", "comprising of", and "consist of" used herein are generally intended to allow other components to be added unless the terms are used with the term "only". Singular forms used herein are intended to include plural forms unless the context clearly indicates otherwise. In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as "directly", "only" are used. A location, arrangement, or disposition of a first element or layer "on" a second element or layer may include that not only is the first element or layer located, arranged, or disposed directly on the second element or layer, but a third element or layer is interposed between the first element or layer and the second element or layer. Herein, situations in which two or more elements included in embodiments of the present disclosure are connected, combined, coupled, contacted, or the like may include not only directly or physically connecting, combining, coupling, or contacting between two or more elements, but interposing of another element between the two or more elements.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The size and thickness of each component shown in the drawings are illustrated for convenience of description, and thus, embodiments of the present disclosure are not necessarily limited thereto. Hereinafter, with reference to the accompanying drawings, various embodiments of the present disclosure will be described in detail.

Figure 2:
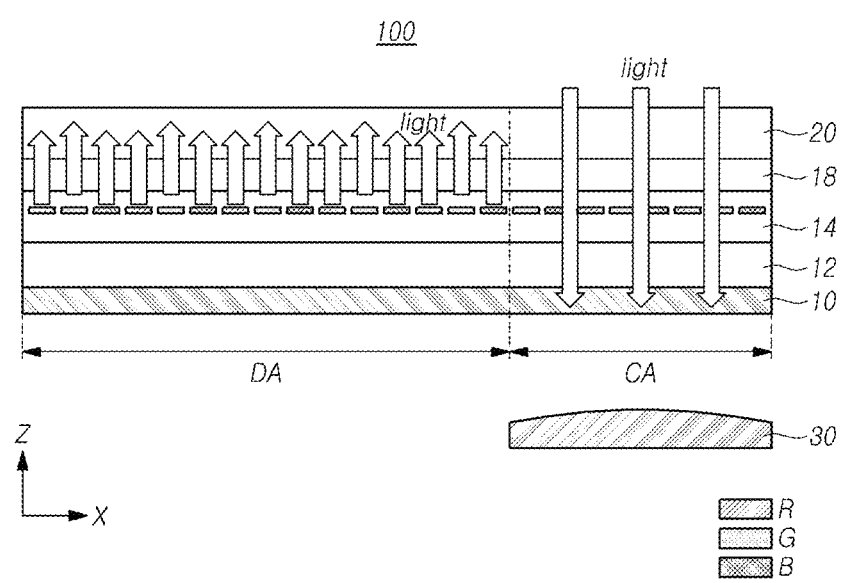
FIG. 2 is a cross-sectional view illustrating schematically a display panel and an optical sensor included in the display device according to aspects of the present disclosure.
Figure 3:
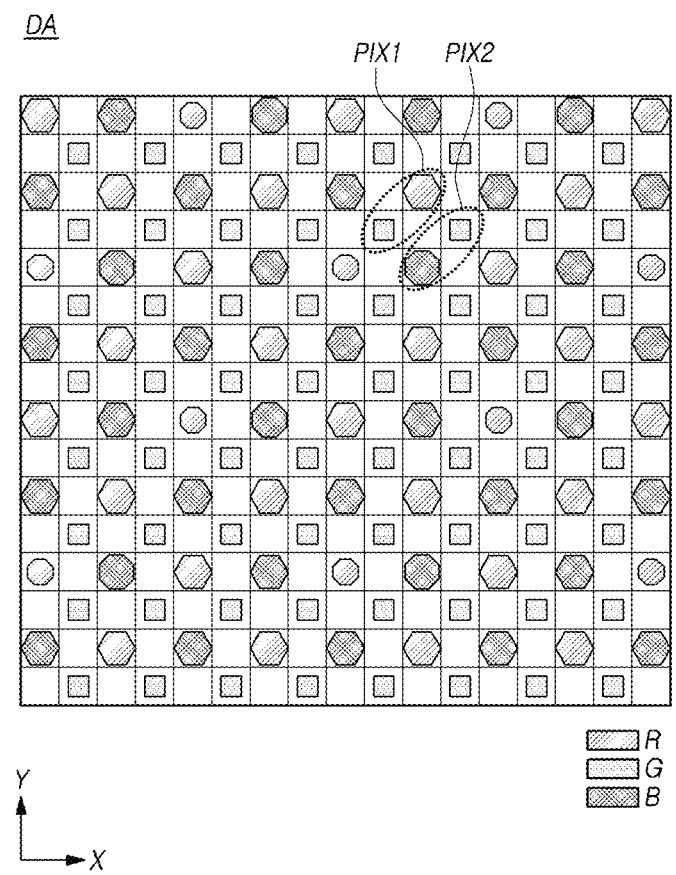
FIG. 3 illustrates pixels disposed in a display area of a display panel according to aspects of the present disclosure.

FIG. 1 illustrates schematically a display device according to aspects of the present disclosure. FIG. 2 is a cross-sectional view illustrating schematically a display panel and an optical sensor included in the display device. FIG. 3 illustrates pixels disposed in a display area of the display panel.

Referring to FIG. 1, the entirety of a surface of the display device 100, or most of the surface, may serve as a display area. The display area may include a first area DA and a second area CA. In this instance, both the first area DA and the second area CA can present images, but may have different resolutions from each other. For example, the resolution of multiple second pixels disposed in the second area CA may be lower than the resolution of multiple first pixels disposed in the first area DA. A sufficient amount of light corresponding to a degree to which the resolution of multiple second pixels disposed in the second area CA is lowered can be allowed to enter one or more sensors (41, 42) disposed in the second area CA. However, embodiments of the present disclosure are not limited thereto. For example, if the second area CA has sufficient light transmittance, or an algorithm suitable for noise compensation is implemented, the resolution of the second area CA may be substantially equal to the resolution of the first area DA.

The second area CA may be an area in which one or more sensors (41, 42) are disposed. The second area CA is an area overlapping one or more sensors; therefore, may have an area smaller than the first area DA in which most images are present. Each sensor (41, 42) may include at least one of an image sensor, a proximity sensor, an illuminance sensor, a gesture sensor, a motion sensor, a fingerprint recognition sensor, and a biometric sensor. For example, a first sensor 41 may be an illuminance sensor, and a second sensor 42 may be an image sensor for detecting still images or moving images; however, embodiments of the present disclosure are not limited thereto.

The second area CA may be placed at a location where the entrance of light is required. For example, the second area CA may be placed in an upper left portion or upper right portion of a display area, or placed across the entirety of an upper portion of the display area or most of the upper portion. In these situations, respective widths of these portions may be variously changed according to desired requirements. However, embodiments described herein are not limited thereto. For example, the second area CA may be placed in a central portion or lower portion of the display area. Hereinafter, the first area DA may be referred to as a display area, and the second area CA may be referred to as an imaging area.

The display area DA and the imaging area CA each may include one or more pixel arrays in which pixels to which pixel data are loaded are arranged. The number of pixels per unit area (e.g., Pixels Per Inch, PPI) of the imaging area CA may be lower than the PPI of the display area DA in order to ensure sufficient light transmittance.

Since both the display area DA and the imaging area CA include pixels, input images can be reproduced on the display area DA and the imaging area CA. Each of pixels in the display area DA and the imaging area CA may include sub-pixels having different colors to implement images with colors. Each sub-pixel may be one of a red sub-pixel (hereinafter, referred to as "R sub-pixel"), a green sub-pixel (hereinafter, referred to as "G sub-pixel"), and a blue sub-pixel (hereinafter, referred to as "B sub-pixel"). Although not shown, each pixel P may further include a white sub-pixel (hereinafter, referred to as "W sub-pixel"). Each sub-pixel may include a pixel circuit and a light emitting element, such as a light emitting diode including an organic light emitting diode (OLED).

The display panel has a width in the X-axis direction, a length in the Y-axis direction, and a thickness in the Z-axis direction. The display panel may include a circuit layer 12 disposed on or over a substrate 10 and a light emitting element layer 14 disposed on or over the circuit layer 12. A polarizing layer 18 may be disposed on or over the light emitting element layer 14, and a cover glass 20 may be disposed on or over the polarizing layer 18.

The circuit layer 12 may include lines such as data lines, gate lines, and power lines, a pixel circuit connected to such lines, a gate driver connected to the gate lines, and the like. The circuit layer 12 may include circuit elements such as at least one transistor implemented as a Thin Film Transistor (TFT), a capacitor, and the like. The lines and circuit elements of the circuit layer 12 may be implemented or disposed in or through a plurality of insulating layers, two or more metal layers separated by an insulating layer therebetween, and an active layer including a semiconductor material.

The light emitting element layer 14 may include a light emitting element driven by the pixel circuit, for example, a light emitting diode including an organic light emitting diode (OLED), or the like. The light emitting element may be implemented as the organic light emitting diode (OLED).

The OLED may include an organic material layer formed between an anode and a cathode. The organic material layer may include a hole injection layer (HIL), a hole transport layer (HTL), an emission layer (EML), an electron transport layer (ETL), and an electron injection layer (EIL); however, embodiments of the present disclosure are not limited thereto. When voltages are applied to the anode and cathode of the OLED, holes passing through the hole transport layer (HTL) and electrons passing through the electron transport layer (ETL) can move to the emission layer (EML), and then form excitons. Thereby, visible light can be emitted from the emission layer (EML). The light emitting element layer 14 may be disposed on or over pixels that selectively transmit respective wavelengths of red light, green light, and blue light, and further include a color filter array.

The light emitting element layer 14 may be covered by an encapsulation layer. The encapsulation layer may have a structure in which an organic film and an inorganic film are alternately stacked. In this instance, the inorganic film may serve to block the penetration of moisture or oxygen, and the organic film may serve to flatten a surface of the inorganic film. In the structure having the multilayer stacked with the organic film and the inorganic film, a path through which moisture or oxygen travels may become longer than that in a structure having a single layer, and therefore, the penetration of moisture/oxygen affecting the light emitting element layer 14 can be effectively prevented.

The polarizing layer 18 may be bonded on the light emitting element layer 14 or the encapsulation layer. The polarizing layer 18 can serve to improve outdoor visibility of the display device. The polarizing layer 18 can serve to reduce light reflected from the surface of the display panel and block light reflected from the metal of the circuit layer 12 to improve brightness of pixels. The polarizing layer 18 may be implemented as a linear polarizing plate 18, a polarizing plate 18 on which a phase delay film is bonded, or a circular polarizing plate 18.

The display device 100 according to aspects of the present disclosure may include an optical sensor disposed under a display screen. The optical sensor can capture external images in a capture mode and supply photographic or moving image data. The optical sensor may correspond to, and be located under, the imaging area CA. In this situation, a lens 30 of the optical sensor may face the imaging area CA. The external light may enter the lens of the optical sensor through the imaging area CA, and the lens 30 may condense the light to the image sensor. Meanwhile, in a situation where the resolution of the imaging area CA is reduced to ensure light transmittance, an image quality compensation algorithm may be applied for compensating for the luminance and color coordinates of pixels in the imaging area CA.

According to embodiments described herein, as pixels are also disposed in the imaging area CA, a full-screen display can be implemented without limitation in the display area due to an optical sensor.

As illustrated in FIG. 3, the display area DA may include pixels arranged in a matrix pattern. Each of the pixels may be implemented as a real-type pixel including R, G, and B sub-pixels of three primary colors, which make up one pixel. Each of the pixels may further include a W sub-pixel omitted in the drawing. Further, two sub-pixels may make up one pixel using a sub-pixel rendering algorithm. For example, a first pixel PIX1 may be made up of R and G sub-pixels, and a second pixel PIX2 may be made up of B and G sub-pixels. Insufficient color representation in each of the pixels PIX1 and PIX2 may be compensated for by an average value of corresponding color data between neighboring pixels.

Figure 4:
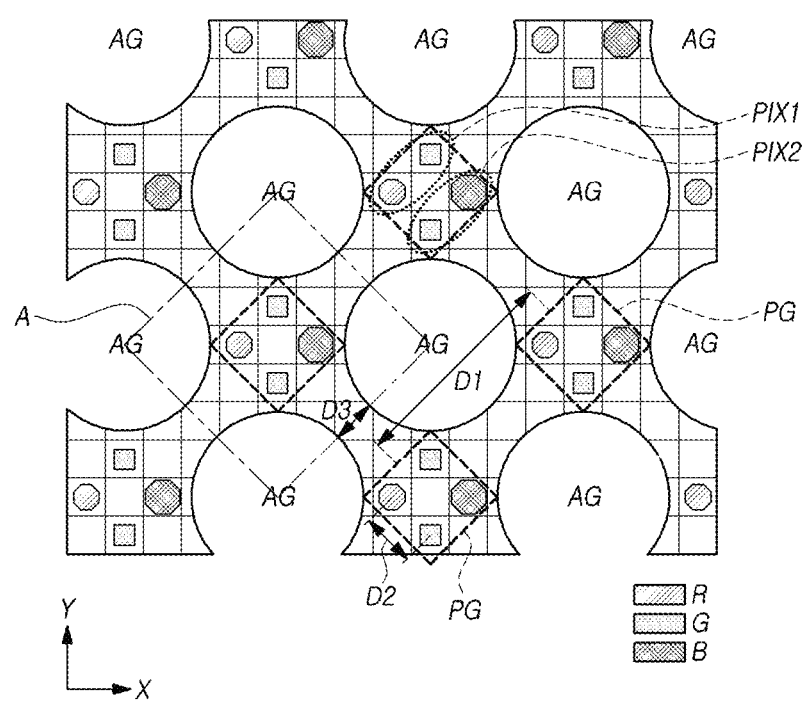
FIG. 4 illustrates pixels in an imaging area, and a light-transmitting area according to aspects of the present disclosure.
Figure 5:
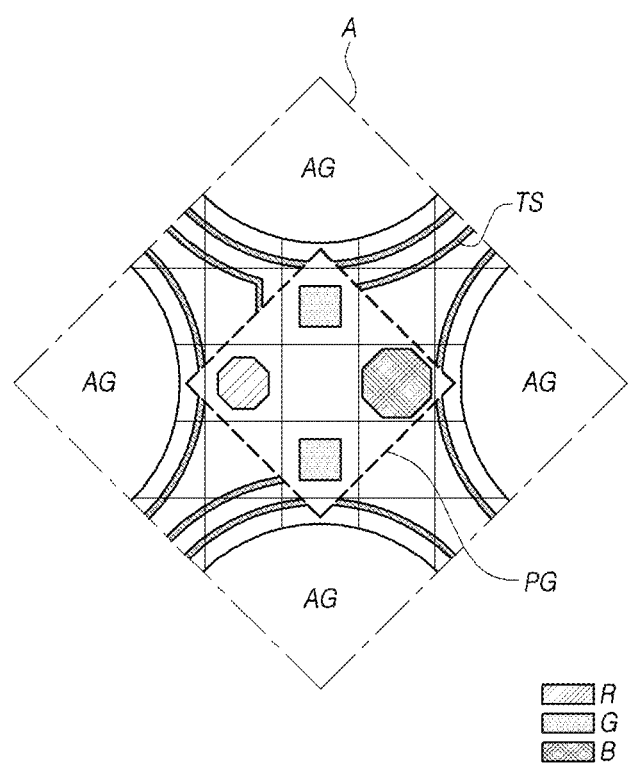
FIG. 5 is an enlarged view for portion A of FIG. 4.

FIG. 4 illustrates an imaging area according to aspects of the present disclosure. FIG. 5 is an enlarged view for portion A of FIG. 4.

Referring to FIGS. 4 and 5, the imaging area CA may include one or more pixel groups PG, each of which includes one or more pixels, spaced apart by a predetermined distance D1 from one another, and one or more light-transmitting areas AG disposed between neighboring pixel groups PG. The light-transmitting area AG may be disposed between pixels. In this manner, more sufficient external light can enter the lens of the optical sensor through the light-transmitting area AG. A shape of the light-transmitting area AG is illustrated in a circular shape; however, embodiments of the present disclosure are not limited thereto. For example, the light-transmitting area AG may be designed in various shapes such as a circle, an ellipse, a polygon, and the like.

The light-transmitting area AG may include one or more transparent materials having high light transmittance for enabling light to enter the light-transmitting area AG such that a loss of the incident light is minimized. For example, the light-transmitting area AG may include transparent insulating materials without including metal lines or pixels. In this instance, the lines TS of the pixels may be disposed outside of the light-transmitting area AG. However, embodiments described herein are not limited thereto; for example, a metal electrode material may remain in a partial area in the light-transmitting area AG. In this manner, the amount of light incident on the sensor through the light-transmitting area may increase, and the light transmittance of the imaging area CA may increase as the light-transmitting area AG increases.

Each pixel group PG may include one or two pixels. Further, each of the pixels may include two to four sub-pixels. For example, each pixel in each pixel group may include all of the R, G, and B sub-pixels, or may include two of the R, G, and B sub-pixels. According to implementations, each pixel may further include W sub-pixel.

A distance D3 between the light-transmitting areas AG may be smaller than a distance (e.g., a pitch) D1 between the pixel groups PG. A distance D2 between the sub-pixels may be smaller than the distance D1 between the pixel groups PG.

Figure 6:
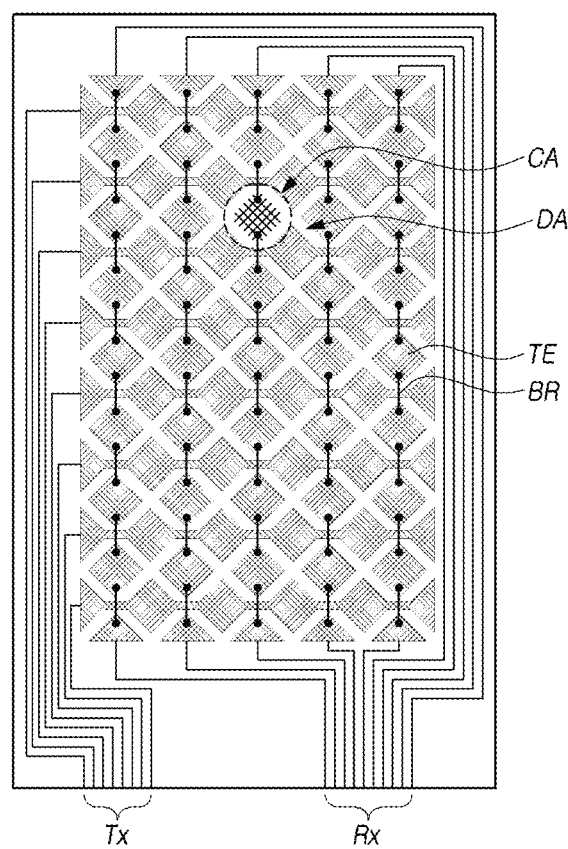
FIG. 6 illustrates a touch sensing portion according to aspects of the present disclosure.
Figure 7:
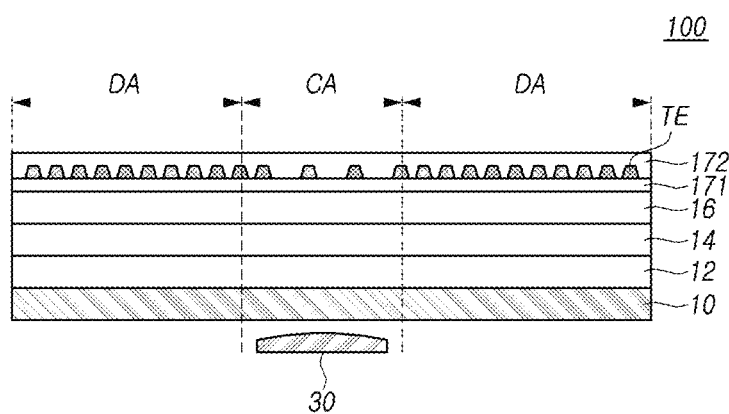
FIG. 7 is a cross-sectional view illustrating the touch sensing portion of FIG. 6.

FIG. 6 illustrates a touch sensing portion according to aspects of the present disclosure. FIG. 7 is a cross-sectional view illustrating the touch sensing portion of FIG. 6.

The display device 100 according to aspects of the present disclosure may include the touch sensing portion TS capable of sensing a touch input performed on an associated display panel. In particular, the touch sensing portion TS included in the display device 100 may be disposed taking account of an imaging area CA located in a display area DA of the display panel. The touch sensing portion TS may include one or more touch electrodes TE, one or more bridges BR, one or more routing lines, and the like. The touch electrode TE may be a surface electrode, a line electrode, and/or a mixture thereof. When the touch electrode TE is the line electrode, the sensing portion may have a mesh pattern in which a plurality of touch electrodes are arranged in the mesh pattern.

In one embodiment, when the touch sensing portion TS is based on the mutual-capacitive sensing scheme, the touch electrodes TE are divided into one or more driving electrodes Tx and one or more sensing electrodes Rx. The driving electrode Tx may have a plurality of channels, and each channel may be routed on a channel basis in a non-pixel area. The sensing electrode Rx may have a plurality of channels, and each channel may be routed one a channel basis in the non-pixel area. The bridge BR may be formed in an area where each driving electrode Tx and each sensing electrode Rx intersect.

The touch sensing portion TS may be provided as a separate panel or may be directly disposed on an encapsulation layer 16. In another embodiment, a touch buffer layer 171 may be disposed on the encapsulation layer 16, and the touch electrode TE and the bridge BR may be disposed on or over the touch buffer layer 171. The touch buffer layer 171 may be formed of an inorganic insulating material. The touch electrode TE may be made up of a single layer or multiple layers including a metal having high corrosion resistance and acid resistance and good conductivity, such as aluminum (Al), titanium (Ti), copper (Cu), molybdenum (Mo), and the like. A touch passivation film 172 may be disposed on the touch electrode TE. The touch passivation film 172 may be formed of an organic insulating material or an inorganic insulating material.

One or more touch electrodes TE may also be disposed in the imaging area CA. If touch electrodes TE are not disposed in the imaging area CA, a problem in forming mutual capacitance may occur, and as a result, the accuracy of touch sensing may be reduced in that portion. In contrast, if touch electrodes TE are densely disposed in the imaging area CA, the accuracy of touch sensing may be increased, but an amount of light incident to the optical sensor 30 may be reduced. In the display device according to aspects of the present disclosure, as shown in FIG. 7, a distance (e.g., a pitch) between touch electrodes TE in the imaging area CA may be relatively smaller than that between touch electrodes TE in the display area DA. For example, a pitch between the touch electrodes TE in the imaging area CA may be two times smaller than a pitch between the touch electrodes TE in the display area DA.

Figure 8A:
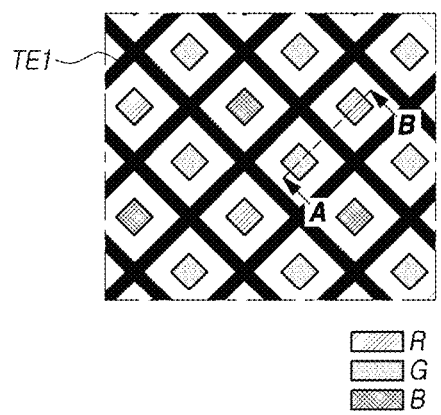
FIGS. 8A and 8B illustrate a touch sensing portion in a display area according to aspects of the present disclosure.
Figure 8B:
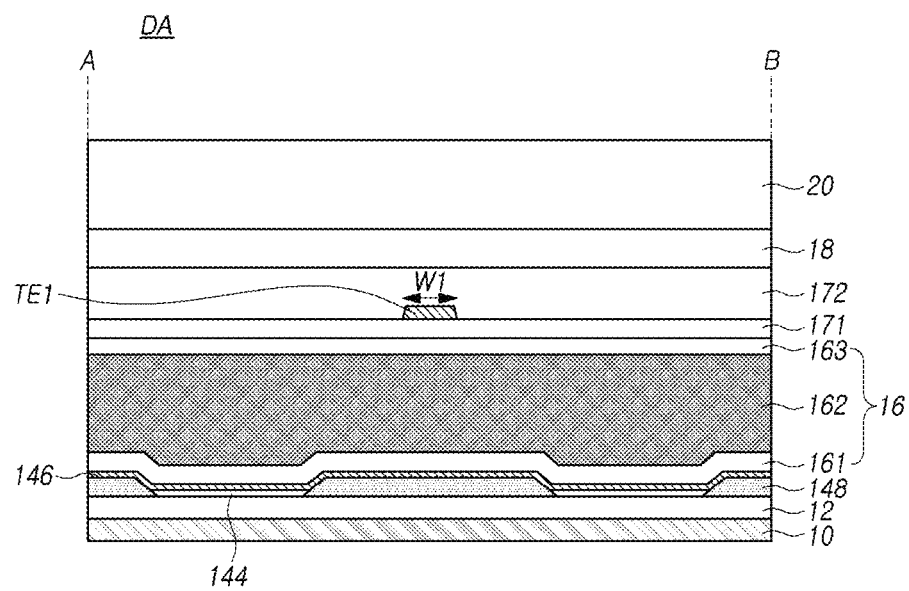
Figure 9A:
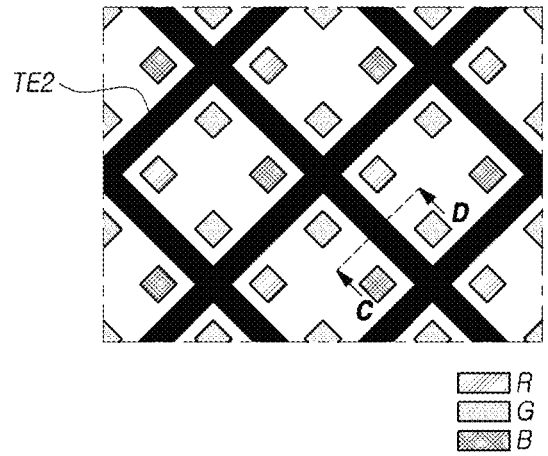
FIGS. 9A and 9B illustrate a touch sensing portion in an imaging area according to aspects of the present disclosure.
Figure 9B:
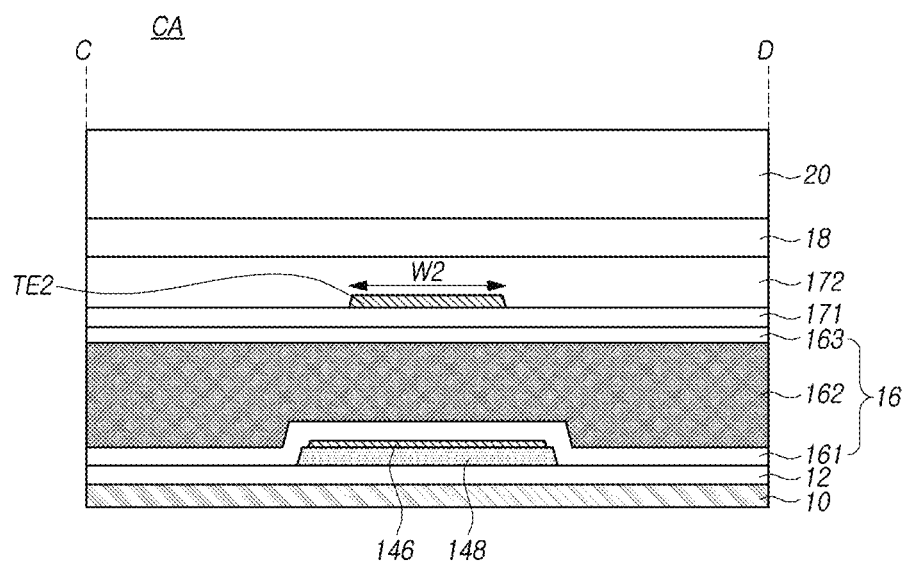

FIGS. 8A and 8B illustrate a touch sensing portion in a display area of the display panel according to aspects of the present disclosure. FIGS. 9A and 9B illustrate a touch sensing portion in an imaging area of the display panel according to aspects of the present disclosure.

The display device according to aspects of the present disclosure may include one or more touch sensing portions that are disposed in various patterns. That is, the display device may include one or more touch sensing portions disposed taking account of characteristics of several portions of the display area.

In one embodiment, the display panel may include a first touch sensing portion disposed in a first area (e.g., display area DA), and a second touch sensing portion disposed in a second area (e.g., imaging area CA) with a density (or pitch) lower (or smaller) than the first touch sensing portion. In this situation, one or more first pixels are disposed in the first area DA, and one or more second pixels are disposed in the second area CA surrounded by the first area DA. In one embodiment, in the same manner as respective densities of the first touch sensing portion in the first area and the second touch sensing portion in the second area, a density of the second pixels disposed in the second area CA may be lower than that of the first pixels disposed in the first area DA. In this arrangement, since the second area CA has a higher light transmittance than the first area DA, an optical sensor (e.g., a camera module) may overlap (correspond to) the second area CA.

Cross-sectional structures of the display panel according to embodiments described herein are shown in FIGS. 8*b* and/or 9b. However, structures of the display panel according to embodiments described herein are not limited thereto. The display panel may have a structure in which a circuit layer 12, a light emitting element layer 14, an encapsulation layer 16, a touch sensing portion, a polarizing layer 18, a cover layer 20, and the like are stacked on or over a substrate 10. The substrate 10 may include a first PI substrate, a second PI substrate, and an inorganic film (IPD) disposed therebetween. The inorganic film IPD can block the penetration of moisture from a lower portion of the second substrate.

The circuit layer 12 may include lines such as data lines, gate lines, and power lines, a pixel circuit connected to such lines, a gate driver connected to the gate lines, and the like. The circuit layer 12 may include circuit elements such as at least one transistor implemented as a thin film transistor (TFT), a capacitor, and the like. The lines and circuit elements of the circuit layer 12 may be implemented with, disposed in, or including, a plurality of insulating layers, a metal layer separated by an insulating layer therebetween, and/or an active layer including a semiconductor material. An upper portion of the circuit layer 12 may be covered with a planarization layer. A circuit element (e.g., TFT) and a light emitting element (e.g., OLDE) of the light emitting element layer may be connected through a hole formed in the planarization layer.

The light emitting element layer 14 may include the light emitting element (e.g., OLDE) driven by the pixel circuit. The light emitting element may include an anode electrode, a cathode electrode 146, and an organic material layer 144 disposed between the anode and cathode electrodes. The anode electrode of the light emitting element may be disposed on or over the planarization layer. The anode electrode may include a transparent or translucent electrode material. The anode electrode may be connected to an electrode of a TFT used as a switch element or a driving element through a contact hole formed in the planarization layer. The anode electrode is formed (patterned) for each sub-pixel.

A portion except for a light emitting area in the upper portion of the anode electrode is covered with a bank 148. At this situation, the bank 148 may cover at least a portion of the anode electrode. However, when desired, as shown in FIG. 9B, the bank 148 may not be disposed in an area where the light emitting element is not disposed. This structure may be implemented to further improve the light transmittance of the light-transmitting area AG.

As described above, the bank 148 may be a pattern of defining a light emitting area (or an opening area) and function as a pixel defining layer for defining a boundary between pixels. A spacer may be formed on the bank 148. The spacer can allow a gap between a fine metal mask (FMM) and the anode electrode to be formed so that the FMM cannot contact the anode electrode during a deposition process of an organic material 144. The bank 148 and the spacer may be integrated with the same organic insulating material.

An organic material layer 144 may be disposed in a light emitting area of each pixel defined by the bank. The cathode electrode 146 that is a second electrode of the light emitting element OLED may be disposed in all or at least a portion of a surface of the display panel to cover the bank, the spacer, and the organic material layer 144. The cathode electrode 146 may be connected to a base power supply (VSS) line formed in any one of metal layers under the cathode electrode 146.

A capping layer may cover the cathode electrode 146. As the capping layer of an inorganic insulating material covers the cathode electrode 146, the capping layer can protect the cathode electrode 146 by blocking the penetration of air and out-gassing of an organic insulating material applied on the capping layer.

The encapsulation layer 16 may be located on or over the cathode electrode or the capping layer. The encapsulation layer 16 may have a structure in which a first inorganic film 161, an organic film 162, and a second inorganic film 163 are sequentially stacked. In this instance, the first inorganic film 161 may cover the capping layer, and the organic film 162 may be disposed on the first inorganic film 161. The organic film 162 may include an organic insulating material. The second inorganic film 163 may be disposed on the organic film 162.

The polarization layer 18 may be disposed on the encapsulation layer 16 and can improve outdoor visibility of the display device. The polarizing layer 18 can serve to reduce light reflected from a surface of the display panel and block light reflected from the metal of the circuit layer 12 to improve brightness of pixels.

The touch sensing portion applied to the display device according to embodiments described herein may be integrated with the display panel. In one embodiment, the display panel may further include an encapsulation layer 16 on or over the first pixels and the second pixels, and the first and second touch sensing portions may be disposed on or over an upper surface of the encapsulation layer 16. That is, as shown in FIG. 8B, a first touch electrode TE1 included in the first touch sensing portion may be directly disposed on the upper surface of the encapsulation layer 16. Likewise, as shown in FIG. 9B, a second touch electrode TE2 included in the second touch sensing portion may be directly disposed on the upper surface of the encapsulation layer 16. In this instance, the first touch electrode TE1 and the second touch electrode TE2 may be disposed on the buffer layer 171 for insulation and/or enhanced adhesive strength. A touch protection film 172 formed of an organic insulating material or an inorganic insulating material may cover the first touch electrode TE1 and the second touch electrode TE2.

A structure of the display panel in a plan view according to embodiments described herein is shown in FIGS. 8A and/or 9A. However, the display panel according to embodiments described herein are not limited thereto. Touch sensing portions included in the display panel or respective elements included in the touch sensing portions may differently arranged in respective areas. That is, touch sensing portions included in the display panel, or respective elements included in the touch sensing portions may be differently disposed in the display area DA and the imaging area CA, respectively.

As described above, since the imaging area CA is required to provide maximal incident light to an optical sensor under the substrate, an arrangement density of either touch sensing portion in the imaging area CA or elements included in touch sensing portion may be reduced compared to that in the display area DA. That is, a distance between touch electrodes included in the touch sensing portion of the imaging area CA may be designed to be longer than a distance between touch electrodes included in display area DA. Inventors of the present disclosure recognized a problem in which although the transmittance of the imaging area may be ensured through such different arrangements, a capacitance between touch electrodes reduces due to a trade-off, and the performance of corresponding touch sensing deteriorates. To address this issue, the inventors invented a structure for uniformly ensuring touch sensing performance while improving the transmittance of the imaging area. Such a structure may be implemented by differently designing shapes of touch electrodes disposed in the display area DA and the imaging area CA.

In one embodiment, a first touch sensing portion disposed in the first area DA and a second touch sensing portion disposed in the second area CA are based on the mutual-capacitive sensing scheme, and corresponding capacitances caused by respective touch inputs into the first and second areas DV and CA may be substantially equal.

Specifically, the first touch sensing portion disposed in the first area DA and the second touch sensing portion disposed in the second area CA respectively may include one or more first touch electrodes TE1 and one or more second touch electrodes TE2, which have a line shape, and a width of the line-shaped second touch electrode TE2 may be larger than that of the line-shaped first touch electrode TE1. This is based on the principle that capacitance is proportional to the cross-sectional area of an electrode and inversely proportional to a distance between electrodes. This principle can be used to compensate for a reduction in capacitance as electrodes are spaced far apart from one another in the second area CA, by increasing cross-sectional areas of the electrodes.

A width W2 of the line-shaped second touch electrode TE2 may be 1.2 to 2 times larger than a width W1 of the line-shaped first touch electrode TE1. For example, a width of the line-shaped second touch electrode TE2 may be 3 um to 24 um.

Specifically, the first touch electrodes TE1 and the second touch electrode TE2 may be arranged in a mesh pattern in respective entire areas. The first touch sensing portion (e.g., one or more electrodes) may be located on or over a bank located between the first pixels, and the second touch sensing portion (e.g., one or more electrodes) may be located on or over a bank located between the second pixels. This is for preventing the first touch sensing portion (e.g., one or more electrodes) and the second touch sensing portion (e.g., one or more electrodes) from blocking respective light emitting areas.

The second area CA may include a light-transmitting area disposed between the second pixels, and the light-transmitting area is an area provided to increase the light transmittance of the second area CA. The second touch sensing portion may not be disposed in the light-transmitting area. The cathode electrode 146 may include an opening corresponding to the light-transmitting area. Such an opening may be formed, after disposing the cathode electrode 146 on the bank 148, by etching the cathode electrode 146 and the bank 148 at one time; however, methods of forming the opening in the cathode electrode are not limited to a specific method. For example, it is possible to form an opening in the cathode electrode, after the cathode electrode has been formed, using an etching process, or a portion of the cathode electrode may be removed by using an IR laser located under the substrate 10.

Figure 10:
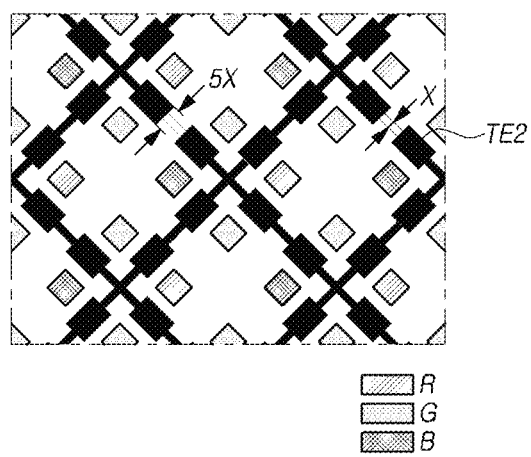
FIG. 10 illustrates touch electrodes according to aspects of the present disclosure.

FIG. 10 illustrates touch electrodes according to aspects of the present disclosure.

As shown in FIG. 10, a line-shaped second touch electrode TE2 disposed in the imaging area CA may include a first portion having a first width X, and a second portion having a second width 5X that is wider than the first width X. The first width X may be equal to or greater than a width of a line-shaped first touch electrode TE1 disposed in the display area DA. The second width 5X may have a width equal to or less than 5 times the first width X.

In the display device according to aspect of present disclosure, since a sufficient amount of light is allowed to enter the optical sensor through the above-described configurations, image quality can be improved, and noises of captured image data can be reduced. Further, in the display device according to aspect of present disclosure, the touch sensing performance of the imaging area can be uniformly maintained.

The display device according to aspects of the present disclosure can be described as follows. The display device includes a substrate having a first surface and a second surface opposite to the first surface, a plurality of first light emitting elements disposed in a first area on the first surface, a plurality of second light emitting elements disposed in a second area surrounded by the first area, a first touch sensing portion disposed in the first area, a second touch sensing portion disposed in the second area with a density lower than the first touch sensing portion, and an optical sensor disposed under the second surface of the substrate. The second area may include a light-transmitting area disposed between the second light emitting elements, and the second touch sensing portion may not be disposed in the light-transmitting area. A density of the second light emitting elements disposed in the second area may be lower than that of the first light emitting elements disposed in the first area.

An encapsulation layer may be disposed on or over the first and second light emitting elements, and the first and second touch sensing portions may be disposed on an upper surface of the encapsulation layer. The first touch sensing portion may be located on or over a bank located between the first light emitting elements, and the second touch sensing portion may be located on or over a bank located between the second light emitting elements.

The first and second touch sensing portions respectively may include first and second touch electrodes having a line shape, and a width of the line-shaped second touch electrode may be larger than that of the line-shaped first touch electrode. For example, a width of the line-shaped second touch electrode may be 1.2 to 2 times larger than that of the line-shaped first touch electrode. A width of the line-shaped second touch electrode may be 3 um to 24 um.

The line-shaped second touch electrode may include a first portion having a first width and a second portion having a second width larger than the first width. The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display panel with a first area and a second area, comprising:
   an encapsulation layer disposed over a substrate in the first area and the second area;
   a touch buffer layer disposed over the encapsulation layer;
   a first touch sensing portion disposed over the touch buffer layer in the first area; and
   a second touch sensing portion disposed over the touch buffer layer in the second area,
   wherein each of the first and second touch sensing portions includes a touch electrode having a mesh pattern of lines,
   wherein at least one of the lines of the mesh pattern of the touch electrode of the first touch sensing portion has a uniform width, and
   wherein at least one of the lines of the mesh pattern of the touch electrode of the second touch sensing portion includes a first portion having a first width and a second portion having a second width different from the first width.

2. The display panel of claim 1, wherein:
   the second width is greater than the first width; and
   the first width is greater than or equal to the width of the at least one of the lines of the mesh pattern of the first touch sensing portion.

3. The display panel of claim 1,
   wherein the second width is equal to or greater than the width of the at least one of the lines of the mesh pattern of the touch electrode of the first touch sensing portion.

4. The display panel of claim 1,
   wherein the second width is equal to or less than 5 times the first width.

5. The display panel of claim 1, further comprising;
   a plurality of pixels disposed between the substrate and the encapsulation layer in the first area and the second area, respectively,
   wherein a pixel arrangement in the second area is different from a pixel arrangement in the first area.

6. The display panel of claim 5,
   wherein the plurality of pixels in the first area are arranged in a matrix pattern, and the plurality of pixels in the second area are arranged in units of pixel groups spaced apart from each other by a predetermined distance.

7. The display panel of claim 1, further comprising;
   a plurality of pixels disposed between the substrate and the encapsulation layer in the first area and the second area, respectively,
   wherein a pixel density in the second area is different from a pixel density in the first area.

8. The display panel of claim 7,
   wherein the pixel density in the second area is lower than the pixel density in the first area.

9. The display panel of claim 1, further comprising one or more camera holes in the second area.

10. The display panel of claim 9, further comprising;
    a plurality of pixels disposed between the substrate and the encapsulation layer in the first area and the second area, respectively,
    wherein the plurality of pixels in the second area are arranged in units of pixel groups, and
    wherein the one or more camera holes are disposed between the pixel groups.

11. The display panel of claim 10,
    wherein a distance between two adjacent camera holes among the one or more camera holes is smaller than a distance between two adjacent pixel groups among the pixel groups.

12. The display panel of claim 9,
    wherein the second touch sensing portion is disposed outside an area where the one or more camera holes are disposed.

13. The display panel of claim 1,
    wherein a pitch of the lines constituting the mesh pattern of the first touch electrode is smaller than a pitch of the lines constituting the mesh pattern of the second touch electrode.

14. The display panel of claim 1, further comprising;
    a plurality of pixels disposed between the substrate and the encapsulation layer in the first area and the second area, respectively; and
    a camera hole between the pixels in the second area,
    wherein a line of one of the plurality of pixels surrounds the camera hole.

15. The display panel of claim 1, wherein the first and second touch sensing portions are based on a mutual-capacitive sensing scheme and are configured so that capacitances caused by respective touch inputs into the first and second areas are uniform with respect to each other.

16. The display panel of claim 1, wherein:
    the at least one of the lines of the mesh pattern of the touch electrode of the second touch sensing portion includes a step shape where the first portion connects to the second portion; and
    the at least one of the lines of the mesh pattern of the touch electrode of the first touch sensing portion does not include a step shape.

17. The display panel of claim 1, further comprising;
    a plurality of pixels including light emitting areas in the first area and the second area, respectively,
    wherein the mesh pattern includes openings so that the touch electrode does not overlap light emitting areas of the display panel in a plan view, and
    wherein the light emitting areas are disposed entirely in the openings of the mesh pattern in the plan view.

18. A display panel, comprising:
    a circuit layer disposed over a substrate;
    a light emitting element layer disposed over the circuit layer;
    an encapsulation layer disposed over the light emitting element layer;
    a first touch sensing portion disposed over the encapsulation layer in a first area of the display panel;
    a second touch sensing portion disposed over the encapsulation layer in a second area of the display panel;
    a polarization layer disposed over the first and the second touch portions; and
    a cover layer disposed over the polarization layer,
    wherein each of the first and second touch sensing portions includes a touch electrode having a mesh pattern of lines,
    wherein at least one of the lines of the mesh pattern of the touch electrode of the first touch sensing portion has a uniform width, and
    wherein at least one of the lines of the mesh pattern of the touch electrode of the second touch sensing portion includes a first portion having a first width and a second portion having a second width different from the first width.

19. The display panel of claim 18,
wherein the first width of the at least one of the lines of the touch electrode of the second touch sensing portion is greater than or equal to the uniform width of the at least one of the lines of the touch electrode of the first touch sensing portion.

20. The display panel of claim 18, further comprising:
a camera module in the second area; and
a camera hole overlapping with the camera module.

21. The display panel of claim 20,
wherein the second touch sensing portion is disposed outside of an area where the camera hole is disposed.

22. The display device of claim 18,
wherein the second width is greater than the first width and is less than or equal to five times the first width.

23. The display device of claim 18, wherein:
the light emitting element layer includes a bank disposed in the first area and the second area, and
the first and the second touch sensing portions are located over the bank and, in a plan view, overlap the bank without overlapping areas outside and adjacent to the bank.

24. The display device of claim 18, further comprising:
a touch buffer layer disposed over the encapsulation layer; and
a touch passivation film disposed between the touch buffer layer and the polarization layer,
wherein the first and the second touch sensing portions are disposed between the touch buffer layer and the touch passivation film.

* * * * *